(12) United States Patent
Chen et al.

(10) Patent No.: US 8,222,139 B2
(45) Date of Patent: Jul. 17, 2012

(54) CHEMICAL MECHANICAL POLISHING (CMP) PROCESSING OF THROUGH-SILICON VIA (TSV) AND CONTACT PLUG SIMULTANEOUSLY

(75) Inventors: Ming-Fa Chen, Taichung (TW); I-Ching Lin, Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 106 days.

(21) Appl. No.: 12/750,364

(22) Filed: Mar. 30, 2010

(65) Prior Publication Data
US 2011/0244676 A1    Oct. 6, 2011

(51) Int. Cl.
*H01L 21/44* (2006.01)

(52) U.S. Cl. .............. 438/667; 257/E21.577; 438/672; 438/675

(58) Field of Classification Search .............. 438/667, 438/672, 675; 257/E21.577
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,642,081 B1 | 11/2003 | Patti |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,897,125 B2 | 5/2005 | Morrow et al. |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |

(Continued)

OTHER PUBLICATIONS

Patti, Robert S., "Three-Dimensional Integrated Circuits and the Future of System-on-Chip Designs", Proceedings of the IEEE, vol. 94, No. 6, Jun. 2006. pp. 1214-1224.

*Primary Examiner* — Asok Sarkar

(74) *Attorney, Agent, or Firm* — Lowe Hauptman Ham & Berner, LLP

(57) ABSTRACT

A method includes forming conductive material in a contact hole and a TSV opening, and then performing one step to remove portions of the conductive material outside the contact hole and the TSV opening to leave the conductive material in the contact hole and the TSV opening, thereby forming a contact plug and a TSV structure, respectively. In some embodiments, the removing step is performed by a CMP process.

10 Claims, 5 Drawing Sheets

U.S. PATENT DOCUMENTS

| | | |
|---|---|---|
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 2009/0224405 A1 | 9/2009 | Chiou et al. |
| 2010/0133660 A1* | 6/2010 | Huyghebaert et al. ........ 257/621 |

* cited by examiner

CHEMICAL MECHANICAL POLISHING (CMP) PROCESSING OF THROUGH-SILICON VIA (TSV) AND CONTACT PLUG SIMULTANEOUSLY

TECHNICAL FIELD

This disclosure relates to integrated circuit fabrication, and more particularly, to chemical mechanical polishing (CMP) processing of a through-silicon via (TSV) and a contact plug simultaneously.

BACKGROUND

Three-dimensional (3D) wafer-to-wafer vertical stack technology seeks to achieve the long-awaited goal of vertically stacking many layers of active IC devices such as processors, programmable devices and memory devices inside a single chip to shorten average wire lengths, thereby reducing interconnect RC delay and increasing system performance. One major challenge of 3D interconnects on a single wafer or in a wafer-to-wafer vertical stack is through-via that provides a signal path for high impedance signals to traverse from one side of the wafer to the other. Through-silicon via (TSV) is typically fabricated to provide the through-via filled with a conducting material that pass completely through the layer to contact and connect with the other TSVs and conductors of the bonded layers.

Currently, TSV process forming a copper via passing through a silicon substrate is combined typical IC process. When the TSV process is right after a contact process, an additional chemical mechanical planarization or polishing (CMP) process is needed to polish the excess Cu overburden to provide surface planarity. Chemical corrosion, photo-corrosion, narrow trench corrosion, and galvanic corrosion are reported to be the possible mechanisms of Cu corrosion during CMP. Galvanic corrosion (also referred to as bimetallic corrosion) occurs due to electrochemical incompatibility between two dissimilar metals that are in electrical and ionic contact. Thus, the additional Cu CMP slurry will cause galvanic corrosion to the contact plug made of tungsten (W), resulting tungsten corrosion.

BRIEF DESCRIPTION OF THE DRAWINGS

The aforementioned objects, features and advantages of this disclosure will become apparent by referring to the following detailed description of the embodiments with reference to the accompanying drawings, wherein.

DETAILED DESCRIPTION OF ILLUSTRATIVE EMBODIMENTS

Figure 1:
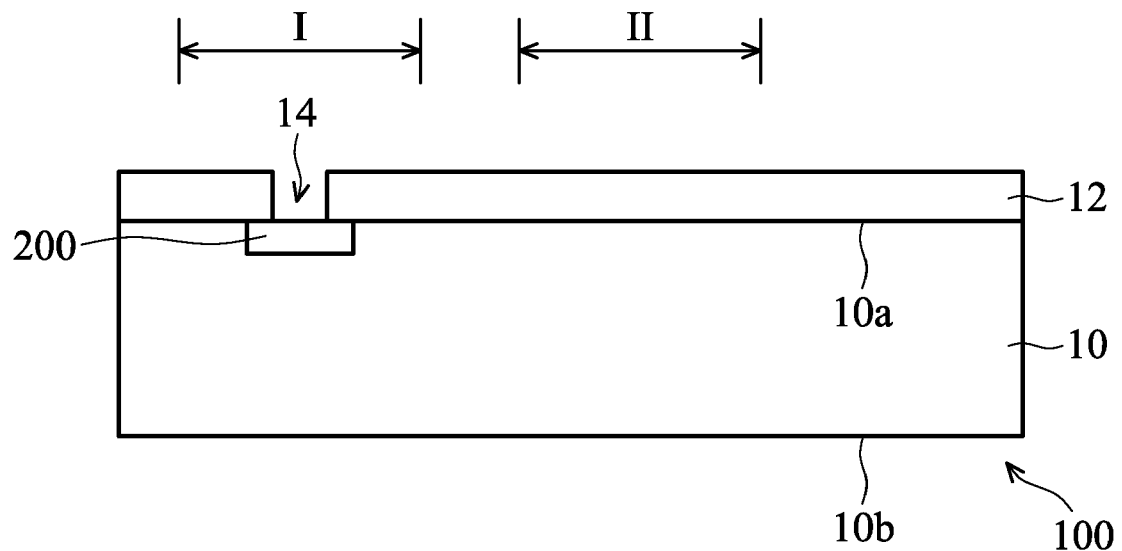
FIGS. 1-5 are cross-sectional views depicting an exemplary embodiment of a portion of a semiconductor device at stages in an integrated circuit manufacturing process.

This disclosure provides embodiments of CMP processing of metallization structures simultaneously. Embodiments of the metallization structure are applicable in forming a contact plug, a through-silicon via (TSV) structure or others. As used throughout this disclosure, the term "through-silicon via (TSV)" refers to an opening filled with at least a conductive material passing through at least a part of a semiconductor substrate or a silicon-containing substrate. Embodiments provide the use of copper metallization in forming TSVs. As employed throughout this disclosure, copper (Cu) is intended to encompass elemental Cu as well as Cu-based alloys substantially exhibiting the electrical properties of Cu.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present disclosure. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIGS. 1-5 are cross-sectional views depicting an exemplary embodiment of a portion of a semiconductor device at stages in an integrated circuit manufacturing process.

With reference to FIG. 1, there is shown a cross-sectional diagram of a wafer 100 including a substrate 10 on which a first region I is defined for a contact plug formation region and a second region II is defined for a TSV structure formation region. An integrated circuit (IC) component 200 processed from the substrate 10, an inter-layer dielectric (ILD) layer 12 overlying the semiconductor substrate 10, and a contact hole 14 formed in the dielectric layer 12 within the first region I for forming a contact plug therein.

In detail, the substrate 10 is typically silicon (Si), for example, a silicon substrate with or without an epitaxial layer, or a silicon-on-insulator substrate containing a buried insulator layer. The substrate 10 may also be made of gallium arsenide (GaAs), gallium arsenide-phosphide (GaAsP), indium phosphide (InP), gallium aluminum arsenic (GaAlAs), indium gallium phosphide (InGaP). The substrate 10 has a front surface 10a (e.g., circuit side) and a back surface 10b (e.g., non-circuit side). The IC component 200 formed in and/or on the front surface 10a of the substrate 10 may comprise multiple individual circuit elements such as transistors, diodes, resistors, capacitors, inductors, and other active and passive semiconductor devices formed by conventional processes known in the integrated circuit manufacturing art. For example, the IC component 200 is a transistor including a gate and source/drain regions The ILD layer 12 is formed on the front surface 10a of the substrate 10 so as to isolate the IC component 200 from a subsequent formation of an interconnection structure. The ILD layer 12 may be a single layer or a multi-layered structure. The ILD layer 12 may be a silicon oxide containing layer formed of doped or undoped silicon oxide by a thermal CVD process or high-density plasma (HDP) process, e.g., undoped silicate glass (USG), phosphorous doped silicate glass (PSG) or borophosphosilicate glass (BPSG). Alternatively, the ILD layer 12 may be formed of doped or P-doped spin-on-glass (SOG), PTEOS, or BPTEOS.

The contact hole 14 is formed in the ILD layer 12 by a dry etching process, exposing a portion of the IC component 200. In an embodiment, following planarization on the ILD layer 12, a dielectric anti-reflective coating (DARC) or/and a bottom anti-reflectance coating (BARC) and a lithographically patterned photoresist layer are provided, which are omitted in the Figures for simplicity and clarity. A dry etching process is then carried out to form the contact holes 14 that pass though the ILD layer 12 so as to expose a contact region of the IC component 200, e.g., a silicide layer positioned over a source/drain region. Then the patterned photoresist and the BARC layer are stripped.

Figure 2:
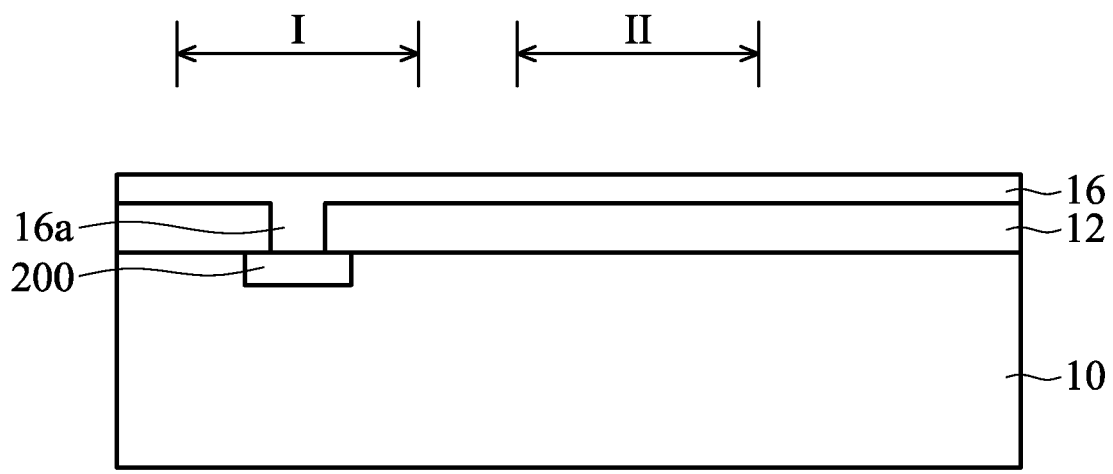

With reference to FIG. 2, a first conductive material layer 16 is deposited on the ILD layer 12 to fill the contact hole 14. Thus the contact hole 14 filled with the first conductive material layer 16 forms a contact plug 16a, electrically connected to the IC component 200. The first conductive material layer 16 may be formed of tungsten, tungsten-based alloy, copper, or copper-based alloy, formed through LPCVD, PECVD, MOCVD, ALD or other advance deposition technology. In one embodiment, the first conductive material layer 16 is formed of tungsten. In some embodiments, the first conductive material layer 16 is formed of copper, molybdenum (Mo), titanium nitride (TiN), tungsten-containing conductive material, or combinations thereof.

Figure 3:
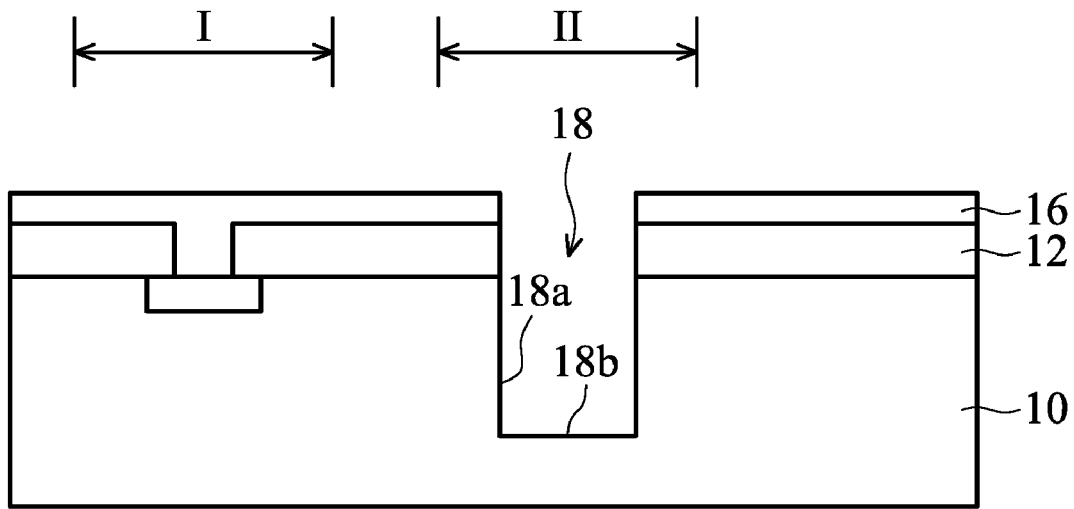

With reference to FIG. 3, the process proceeds to the formation of an opening 18 within the second region II. The opening 18 penetrates the first conductive material layer 16 and the ILD layer 12 and extends to reach a predetermined depth of the substrate 10, without exposing the contact plug 16a and the IC component 200. In an embodiment of forming a TSV structure, the opening 18 is a TSV opening in which a metallization process will be performed. In defining the TSV opening 18, a hard mask layer is formed on the first conductive material layer 16 followed by forming a patterned photoresist layer thereon. The hard mask layer may be a silicon nitride layer, a silicon oxynitride layer or the like. The photoresist layer not shown in the figures is patterned by exposure, bake, developing, and/or other photolithography processes known in the art to provide an opening exposing the hard mask layer. The exposed hard mask layer is then etched, by a wet etch or dry etch process, using the patterned photoresist layer as a masking element to provide an opening. Using the hard mask layer and the patterned photoresist layer as mask elements, an etching process is performed to etching the exposed substrate 10, forming the TSV opening 18 with sidewall portions 18a and a bottom portion 18b. After the formation of the TSV opening 18, the hard mask layer and the photoresist layer are removed.

The TSV opening 18 passes through at least a portion of the substrate 10. The TSV opening 18 may be etched using any suitable etching method including, for example, plasma etch, a chemical wet etch, a laser drill, and/or other processes known in the art. In one embodiment, the etching process includes a deep reactive ion etching (RIE) process to etch the substrate 10. The etching process may be such that the TSV opening 18 is etched from the front surface 10a to reach approximately tens of micron~hundreds of micron in depth without passing through the back surface 10b. The etching process may result in an opening having a vertical sidewall profile or a tapered sidewall profile. In one embodiment, the TSV opening 18 has a depth of approximately 20~100 um, and a diameter of approximately 1.5~10 um. The TSV opening 18 has a high aspect ratio between approximately 5 and approximately 10. In some embodiments, the aspect ratio of the TSV opening 18 is greater than 10.

Figure 4:
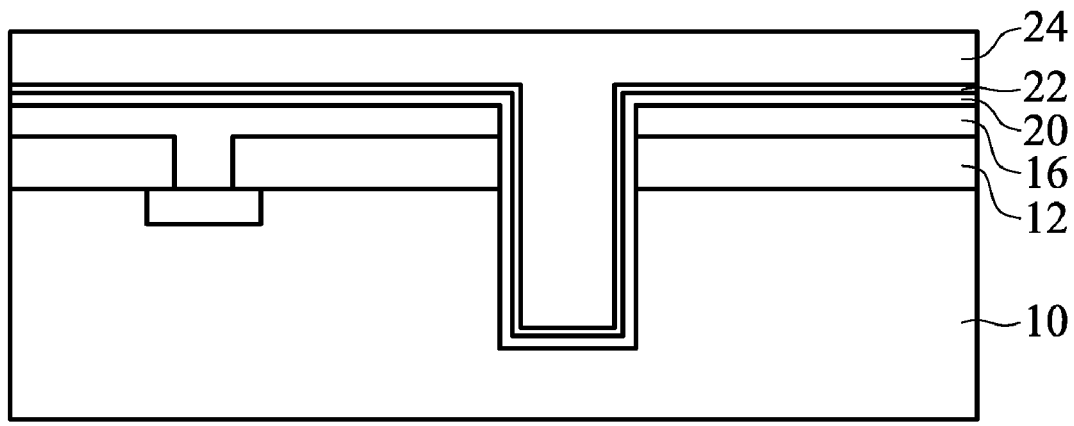

With reference to FIG. 4, a passivation layer 20 is conformally deposited on the resulted structure to line the sidewall portions 18a and bottom portion 18b of the TSV opening 18 in order to prevent any conducting material from leaching into any active portions of the circuitry of the wafer 100. The passivation layer 20 may be formed of silicon oxide, TEOS oxide, silicon nitride, combinations thereof, or the like. The deposition can be carried out using any of a variety of techniques, including thermal oxidation, LPCVD (low-pressure chemical vapor deposition), APCVD (atmospheric-pressure chemical vapor deposition), PECVD (plasma-enhanced chemical vapor deposition) and future-developed deposition procedures. For example, an LPCVD or PECVD process with tetraethylorthosilicate (TEOS) and $O_3$ may be employed to form a TEOS oxide film.

Referring to FIG. 4, a barrier layer 22 is then formed on the passivation layer 20, lining the TSV opening 18. The barrier layer 22 functions as a diffusion barrier to prevent metal diffusion and as an adhesion layer between metal and dielectric. Refractory metals, refractory metal-nitrides, refractory metal-silicon-nitrides and combinations thereof are typically used for the barrier layer 22. The diffusion barrier layer may include, but is not limited to, a refractory material, TiN, TaN, Ta, Ti, TiSN, TaSN, W, WN, Cr, Nb, Co, Ni, Pt, Ru, Pd, Au, CoP, CoWP, NiP, NiWP, mixtures thereof, or other materials that can inhibit diffusion of copper into the ILD layer 12 by means of PVD, CVD, ALD or electroplating. In an embodiment, the barrier layer 22 includes a TaN layer and a Ta layer. In another embodiment, the barrier layer 22 is a TiN layer. In another embodiment, the barrier layer 22 is a Ti layer.

The process proceeds to the formation of TSV-filled process. A second conductive material layer 24 is formed on the barrier layer 22 to fill the TSV opening 18. The second conductive material layer 24 includes a low resistivity conductor material selected from the group of conductor materials including, but is not limited to, copper and copper-based alloy. For example, a copper-fill process includes metal seed layer deposition and copper electro plating. The metal seed layer deposition may be formed by physical vapor deposition. Other methods for forming copper seed layer, such as CVD are known in the art. Then the wafer 100 is transferred to a plating tool, such as an electrochemical plating (ECP) tool, and a copper layer is plated on the wafer 100 by the plating process to fill the TSV opening 18. While ECP process is described herein, the embodiment is not limited to ECP deposited metal. Alternatively, the second conductive material layer 24 may include various materials, such as tungsten, aluminum, gold, silver, and the like.

Figure 5:
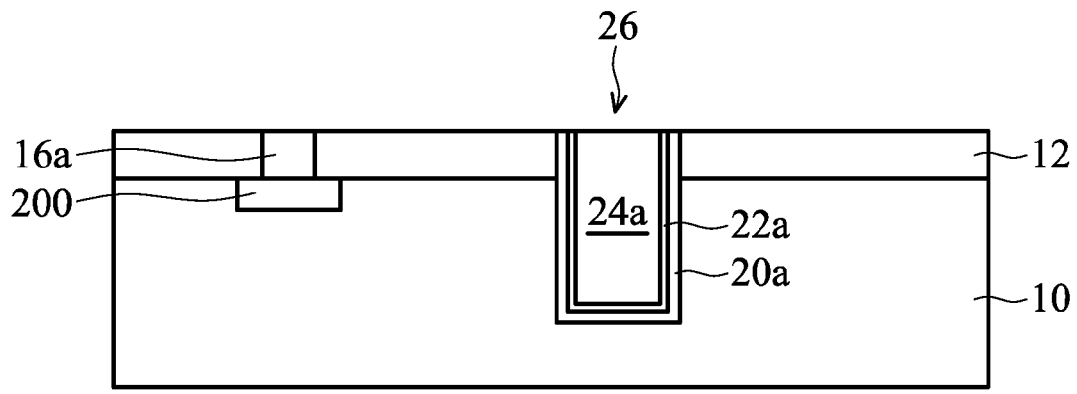

Next, as shown in FIG. 5, the excess portions of the second conductive material layer 24, the barrier layer 22, the passivation layer 20 and the first conductive material layer 16, which are positioned outside the TSV opening 18 and the contact hole 14, are removed, through a chemical mechanical polishing (CMP) process. Thus, the upper surfaces of the conductive material layers 16 and 24 are substantially coplanar with the upper surface of ILD layer 12. The portion 24a of the second conductive layer 24 remaining in the TSV opening 18 forms a TSV structure 26 extending through the ILD layer 12 and a predetermined depth of the substrate 10. The portion 22a of the barrier layer 22 remaining in the TSV opening 18 also forms a part of the TSV structure 26. The portion 20a of the passivation layer 20 remaining on the sidewall portions 18a and the bottom portion 18b of the TSV opening 18 to isolate the TSV structure 26 from other elements.

This CMP process advantageously removes all of these materials layers 24, 22, 20 and 16 simultaneously at the substantially same material removal rates. Compared with the conventional method of performing two steps of CMP processes for the contact plug process and TSV process respectively, this disclosure provides embodiments of CMP processing of the contact plug and the TSV structure simultaneously to reduce process costs. There is no need to develop new slurry used for the CMP process of the TSV structure, and a step of depositing a CMP stop layer used for the conventional CMP process of the TSV structure can be therefore omitted.

Subsequently, back-end-of-line (BEOL) interconnection technologies will be processed on the wafer 100 to fabricate an interconnection structure including a plurality of interconnection layers and inter-metal dielectric (IMD) layers. Embodiments of the present invention use copper-based conductive materials for forming the interconnection layers. The copper-based conductive material is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. A standard damascene process may be used with the copper BEOL interconnection.

FIGS. 6-9 are cross-sectional views depicting another exemplary embodiment of a portion of a semiconductor device at stages in an integrated circuit manufacturing process, while explanation of the same or similar portions to the description in FIGS. 1 to 5 will be omitted.

Figure 6:
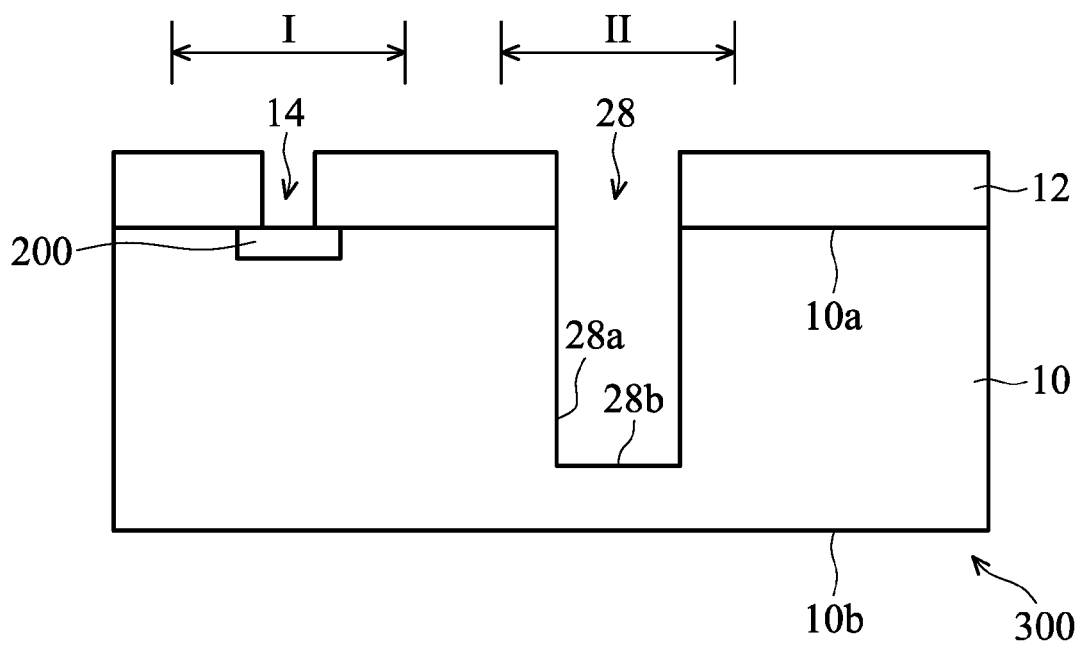
FIGS. 6-9 are cross-sectional views depicting another exemplary embodiment of a portion of a semiconductor device at stages in an integrated circuit manufacturing process.

With reference to FIG. 6, there is shown a cross-sectional diagram of a wafer 300 comprising a substrate 10, a IC component 200 processed from the substrate 10, and an interlayer dielectric (ILD) layer 12 overlying the semiconductor substrate 10. Also, a contact hole 14 is formed in the ILD layer 12 within the first region I by photolithography and dry etching processes, so as to expose a portion of the IC component 200. In addition, using mask elements and etching processes, a TSV opening 28 is formed within the second region II, outside the contact hole 14, to pass through the ILD layer 12 and extend to reach a predetermined depth of the substrate 10. In one embodiment, the formation of the contact hole 14 and the TSV opening 28 can be done by the same photolithography and etching processes. In another embodiments, the formation of the contact hole 14 and the TSV opening 28 can be done by different photolithography and etching steps.

Figure 7:
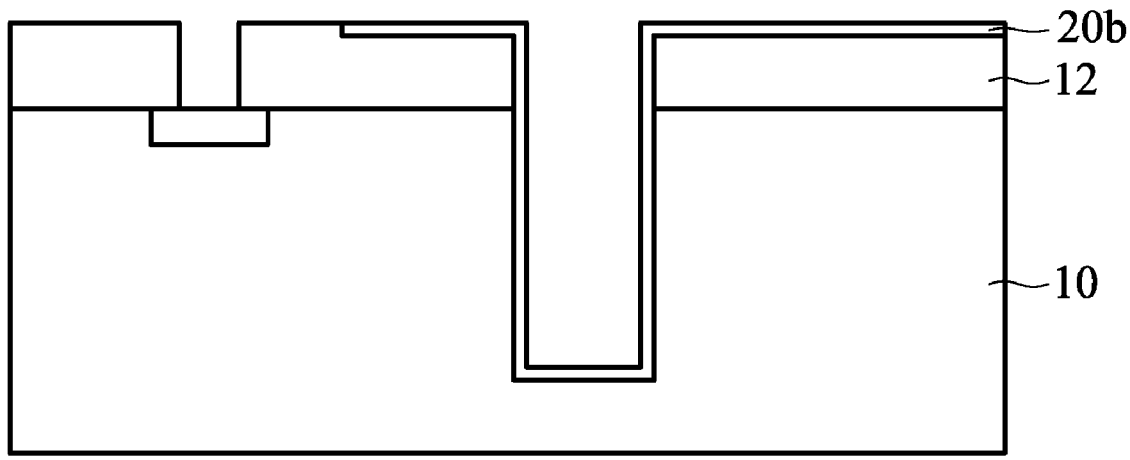

With reference to FIG. 7, a passivation layer 20 is conformally deposited on the resulted structure and then patterned by using photolithography and etching technologies so as to remove a portion of the passivation layer 20 from the contact hole 14, and leave a portion 20b of the passivation layer 20 in the TSV opening 28. The remaining portion 20b of the passivation layer 20 lines the sidewall portions 28a and bottom portion 28b of the TSV opening 28 in order to prevent any conducting material from leaching into any active portions of the circuitry of the wafer 300. The remaining portion 20b of the passivation layer 20 may extend to the upper surface of the ILD layer 12.

Figure 8:
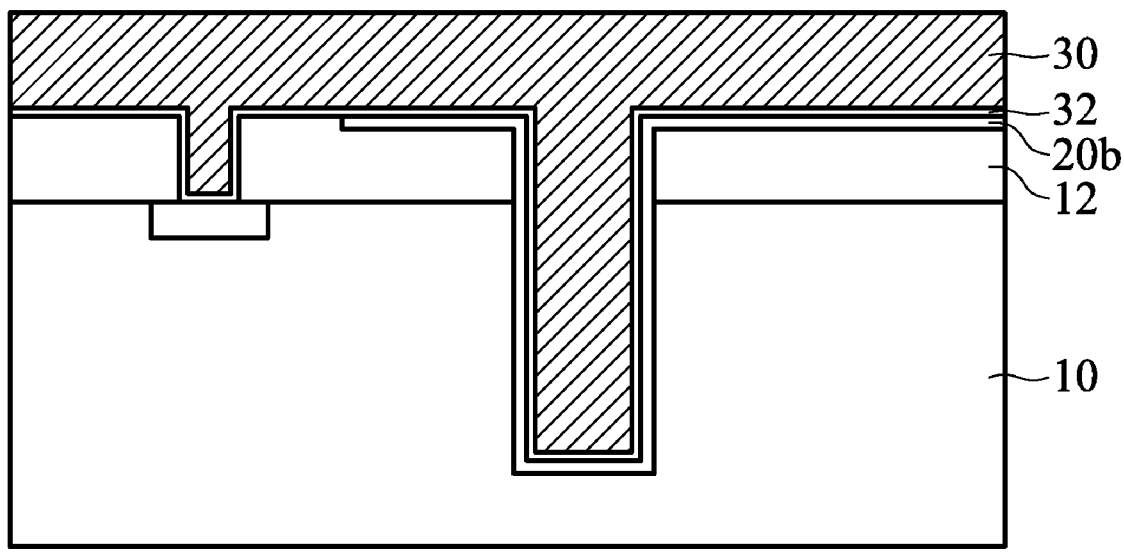

With reference to FIG. 8, the process proceeds to the formation of metal-filled process. A third conductive material layer 30 is deposited on the resulted structure (over the ILD layer 12 and the passivation layer 20b) to fill the contact hole 14 and the TSV opening 28 simultaneously. The third conductive material layer 30 may be formed of tungsten, tungsten-based alloy, copper, or copper-based alloy, aluminum, gold, silver, molybdenum (Mo), titanium nitride (TiN), and the like, formed through LPCVD, PECVD, MOCVD, ALD or other advance deposition technology. For example, a copper-fill process includes metal seed layer deposition and copper electrochemical plating.

In some embodiments, a barrier layer 32 is optionally deposited before the formation of the third conductive material layer 30. The barrier layer 32 functions as a diffusion barrier to prevent metal diffusion and as an adhesion layer between metal and dielectric. Refractory metals, refractory metal-nitrides, refractory metal-silicon-nitrides and combinations thereof are typically used for the barrier layer 32. The diffusion barrier layer may include, but is not limited to, a refractory material, TiN, TaN, Ta, Ti, TiSN, TaSN, W, WN, Cr, Nb, Co, Ni, Pt, Ru, Pd, Au, CoP, CoWP, NiP, NiWP, mixtures thereof, or other materials that can inhibit diffusion of copper into the ILD layer 12 by means of PVD, CVD, ALD or electroplating.

Figure 9:
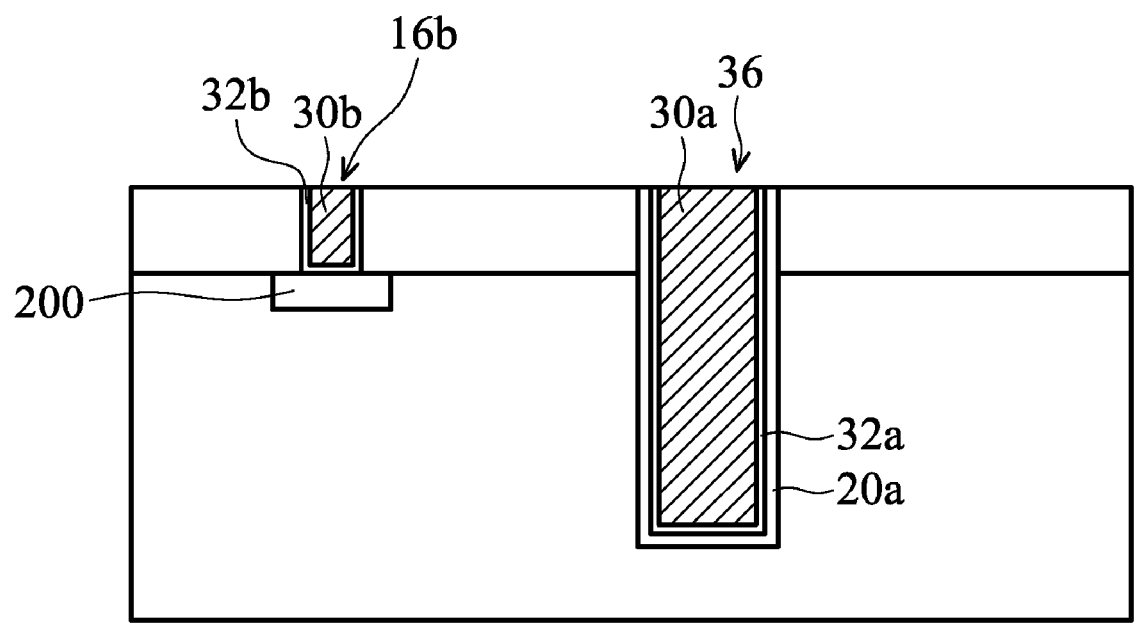

Next, as shown in FIG. 9, the excess portions of the third conductive material layer 30, the optional barrier layer 32 and the passivation layer 20b, which are positioned outside the TSV opening 28 and the contact hole 14, are removed, through a chemical mechanical polishing (CMP) process. Thus, the upper surface of the third conductive material layer 30 is substantially coplanar with the upper surface of ILD layer 12. The portion 30a of the third conductive material layer 30 remaining in the TSV opening 28 forms a TSV structure 36, which extends through the ILD layer 12 and a predetermined depth of the substrate 10. The portion 32a of the barrier layer 32 remaining in the TSV opening 28 also forms a part of the TSV structure 36. The portion 20a of the passivation layer 20 remaining on the sidewall portions 28a and the bottom portion 28b of the TSV opening 28 isolates the TSV structure 36 from other elements. Furthermore, the portion 30b of the third conductive material layer 30 remaining in the contact hole 14 forms a contact plug 16b, electrically connected to the IC component 200. The portion 32b of the barrier layer 32 remaining in the contact hole 14 also forms a part of the contact plug 16b.

Compared with the conventional method of performing two steps of metal deposition and two steps of CMP processes for the contact plug process and TSV process respectively, this disclosure provides embodiments of filling the contact hole and the TSV opening with a conductive material layer simultaneously and performing a CMP processing of the contact plug and the TSV structure simultaneously. In addition to the advantages of performing one step of CMP process, the one step of metal-filling process can further reduce process costs.

In the preceding detailed description, the disclosure is described with reference to specifically exemplary embodiments thereof. It will, however, be evident that various modifications, structures, processes, and changes may be made thereto without departing from the broader spirit and scope of the disclosure, as set forth in the claims. The specification and drawings are, accordingly, to be regarded as illustrative and not restrictive. It is understood that the disclosure is capable of using various other combinations and environments and is capable of changes or modifications within the scope of the inventive concept as expressed herein.

What is claimed is:

1. A method of forming a through-silicon via (TSV) structure, comprising:
providing a semiconductor substrate having a first region and a second region;
forming a dielectric layer on the semiconductor substrate, wherein the dielectric layer comprises a first opening in the first region;

forming a first conductive material layer on the dielectric layer, filling the first opening;

forming a second opening in the second region extending through the first conductive material layer, the dielectric layer and a portion of the semiconductor substrate, wherein the second opening has a sidewall portion and a bottom portion;

forming a passivation layer overlying the first conductive material layer and lining the sidewall portion and the bottom portion of the second opening;

forming a second conductive material layer overlying the passivation layer, filling the second opening; and removing portions of the second conductive material layer, the passivation layer and the first conductive material layer positioned outside the first opening and the second opening to expose the dielectric layer, wherein a portion of the second conductive material layer remaining in the second opening forms the TSV structure.

2. The method of claim 1, wherein said removing is performed by a chemical mechanical polishing (CMP) process.

3. The method of claim 1, wherein the portion of the first conductive material layer remaining in the first opening forms a contact plug.

4. The method of claim 1, further comprising:
forming an integrated circuit (IC) component on the semiconductor substrate before forming a dielectric layer on the semiconductor substrate, wherein the first opening exposes the IC component.

5. The method of claim 1, wherein the first conductive material layer comprises tungsten, tungsten alloy, copper, or copper alloy.

6. The method of claim 1, wherein the second conductive material layer comprises copper, or copper alloy.

7. The method of claim 1, wherein the passivation layer comprises oxide.

8. The method of claim 1, further comprising:
forming a barrier layer on the passivation layer before forming the second conductive material layer.

9. The method of claim 8, wherein the barrier layer comprises Ti, Ta, TiN, or TaN.

10. The method of claim 1, wherein:
the dielectric layer is an inter-layer dielectric (ILD) layer comprising at least one selected from the group consisting of
a silicon oxide containing layer formed of doped or undoped silicon oxide,
doped or P-doped spin-on-glass (SOG),
Phosphorus-doped Tetraethoxy Silane (PTEOS), and
Boron-Phosphosilicate Tetraethoxy Silane (BPTEOS); and
the first conductive material layer is formed directly on the ILD layer.

* * * * *